United States Patent
Joyce et al.

(10) Patent No.: US 11,018,630 B2
(45) Date of Patent: May 25, 2021

(54) DISABLED MODE ERROR REDUCTION FOR HIGH-VOLTAGE BILATERAL OPERATIONAL AMPLIFIER CURRENT SOURCE

(71) Applicant: Hamilton Sundstrand Corporation, Charlotte, NC (US)

(72) Inventors: Thomas P. Joyce, Rockford, IL (US); Matthew Campbell, Batavia, IL (US)

(73) Assignee: HAMILTON SUNSTRAND CORPORATION, Charlotte, NC (US)

( * ) Notice: Subject to any disclaimer, the term of this patent is extended or adjusted under 35 U.S.C. 154(b) by 57 days.

(21) Appl. No.: 16/429,093

(22) Filed: Jun. 3, 2019

(65) Prior Publication Data
US 2020/0382073 A1    Dec. 3, 2020

(51) Int. Cl.
| | |
|---|---|
| *H03F 1/02* | (2006.01) |
| *H03F 3/45* | (2006.01) |
| *H03F 1/26* | (2006.01) |
| *H03F 1/34* | (2006.01) |

(52) U.S. Cl.
CPC ............. *H03F 1/26* (2013.01); *H03F 1/34* (2013.01); *H03F 3/45071* (2013.01); *H03F 2200/129* (2013.01); *H03F 2200/231* (2013.01); *H03F 2203/45528* (2013.01)

(58) Field of Classification Search
CPC .................................... H03F 1/02; H03F 3/45
USPC .......................................... 330/9, 69
See application file for complete search history.

(56) References Cited

U.S. PATENT DOCUMENTS

| | | | |
|---|---|---|---|
| 4,053,797 A | 10/1977 | Tosuntikool et al. | |
| 5,061,900 A | 10/1991 | Vinn et al. | |
| 5,867,777 A | 2/1999 | Yamaji et al. | |
| 6,515,464 B1 | 2/2003 | Darmawaskita et al. | |
| 8,333,875 B2 | 12/2012 | Matsuoka et al. | |
| 8,390,262 B2 * | 3/2013 | Chang .................. | G09G 3/3413 323/282 |
| 2008/0054999 A1 | 3/2008 | Chen | |

OTHER PUBLICATIONS

European Search Report; European Application No. 19211788.5; Filed: Nov. 27, 2019: dated May 15, 2020; 11 pages.

* cited by examiner

*Primary Examiner* — Steven J Mottola
(74) *Attorney, Agent, or Firm* — Cantor Colburn LLP

(57) ABSTRACT

Provided are embodiments that include a circuit configured to operate in a disabled mode error reduction for high-voltage bilateral operational amplifier current source. The circuit includes an operational amplifier, and a switching circuit coupled to the operation amplifier, wherein the switching circuit is operable in a normal mode and a disabled mode, wherein the disabled mode reduces error current at the output of the operational amplifier. Also provided are embodiments for a method for operating a circuit in a disabled mode for error reduction.

14 Claims, 3 Drawing Sheets

DISABLED MODE ERROR REDUCTION FOR HIGH-VOLTAGE BILATERAL OPERATIONAL AMPLIFIER CURRENT SOURCE

BACKGROUND

The present disclosure generally relates to circuits and more specifically to operating a high-voltage bilateral operational amplifier current source in a disabled mode for error reduction.

Operational amplifiers are used in a variety of applications. The operational amplifier is configured to receive a differential input and provided an output based on the difference between the two inputs. For example, operational amplifiers can be used as comparators to determine an outcome between voltage states. In addition, operational amplifiers can be operated to amplify a signal to obtain a particular gain according to a transfer characteristic. Because operational amplifiers are used in many applications, there may be a need to minimize any error or unwanted effects produced by the operational amplifier.

BRIEF DESCRIPTION

According to an embodiment, a circuit configured to operate in a disabled mode error reduction for high-voltage bilateral operational amplifier current source is provided. The circuit an operational amplifier, and a switching circuit coupled to the operation amplifier, wherein the switching circuit is operable in a normal mode and a disabled mode, wherein the disabled mode reduces error current at the output of the operational amplifier.

In addition to one or more of the features described herein, or as an alternative, further embodiments include a two-channel analog switch.

In addition to one or more of the features described herein, or as an alternative, further embodiments include a first channel of the switching circuit that is controlled to be connected to an inverting input of the operational amplifier and a second channel of the switching circuit that is controlled to be connected to a non-inverting input of the operational amplifier.

In addition to one or more of the features described herein, or as an alternative, further embodiments include a first channel of the switching circuit that is configured to receive a command voltage and a second channel of the switching circuit that is configured to receive a reference voltage.

In addition to one or more of the features described herein, or as an alternative, further embodiments include a first channel and a second channel of the switching circuit that are configured to be operated in the normal mode and the disabled mode.

In addition to one or more of the features described herein, or as an alternative, further embodiments include when operating in a disabled mode the first channel of the switching circuit is disconnected from the command signal and the second channel is disconnected from the reference signal and connected to a ground.

In addition to one or more of the features described herein, or as an alternative, further embodiments include a switching circuit that is controlled by an enable signal.

In addition to one or more of the features described herein, or as an alternative, further embodiments include a switching circuit that is operated in the normal mode when the enable signal is received.

According to an embodiment, a method for operating a circuit in a disabled mode for error reduction is provided. The method includes controlling a mode of a switching circuit, wherein the mode includes a normal mode and disabled mode wherein the disabled mode reduces an error current at an output of the operational amplifier, operating the operational amplifier based at least in part on the mode, wherein the operational amplifier is connected to the switching circuit.

In addition to one or more of the features described herein, or as an alternative, further embodiments include controlling a mode of the switching circuit that is capable switching the mode of the switching circuit, wherein the switching circuit is a two-channel analog switch.

In addition to one or more of the features described herein, or as an alternative, further embodiments include a first channel of the switching circuit that is controlled to be connected to an inverting input of the operational amplifier and a second channel of the switching circuit that is controlled to be connected to a non-inverting input of the operational amplifier.

In addition to one or more of the features described herein, or as an alternative, further embodiments include receiving a command voltage at the first channel of the switching circuit and receiving a reference voltage signal at the second channel of the switching circuit.

In addition to one or more of the features described herein, or as an alternative, further embodiments include a first channel and a second channel of the switching circuit are configured to be operated in the normal mode and the disabled mode.

In addition to one or more of the features described herein, or as an alternative, further embodiments include when operating in a disabled mode the first channel of the switching circuit is disconnected from the command signal and the second channel is disconnected from the reference signal and connected to a ground.

In addition to one or more of the features described herein, or as an alternative, further embodiments include operating a switching circuit is controlled by an enable signal.

In addition to one or more of the features described herein, or as an alternative, further embodiments include operating in the normal mode responsive to receiving the enable signal.

Technical effects of embodiments of the present disclosure include reducing the generation of unwanted current when the circuit is not in use.

The foregoing features and elements may be combined in various combinations without exclusivity, unless expressly indicated otherwise. These features and elements as well as the operation thereof will become more apparent in light of the following description and the accompanying drawings. It should be understood, however, that the following description and drawings are intended to be illustrative and explanatory in nature and non-limiting.

BRIEF DESCRIPTION OF THE DRAWINGS

The following descriptions should not be considered limiting in any way. With reference to the accompanying drawings, like elements are numbered alike.

DETAILED DESCRIPTION

Operational amplifiers can be configured to incorporate an open-loop or a closed-loop architecture. When configured in an open-loop, the operational amplifier will act as a comparator. When operated in a closed-loop architecture, the output of the operational amplifier is fed back to an input of the amplifier which can be used to help control the gain produced by the operational amplifier.

Oftentimes, the operational amplifiers remain connected to the reference voltage and a command voltage whose error can be amplified when commanded to be zero. That is, the unwanted error can be amplified when the operational amplifier is not in use. The techniques described herein provide an architecture and method for operating the operational amplifier to substantially reduce the amplified error through the amplifier due to offset voltage. The offset voltage is an effective error voltage internal to the operational amplifier causing the two input terminals to deviate from an ideal differential voltage of zero. The error parameter can be substantial and detrimental for the high-voltage variety of operational amplifiers.

Figure 1:
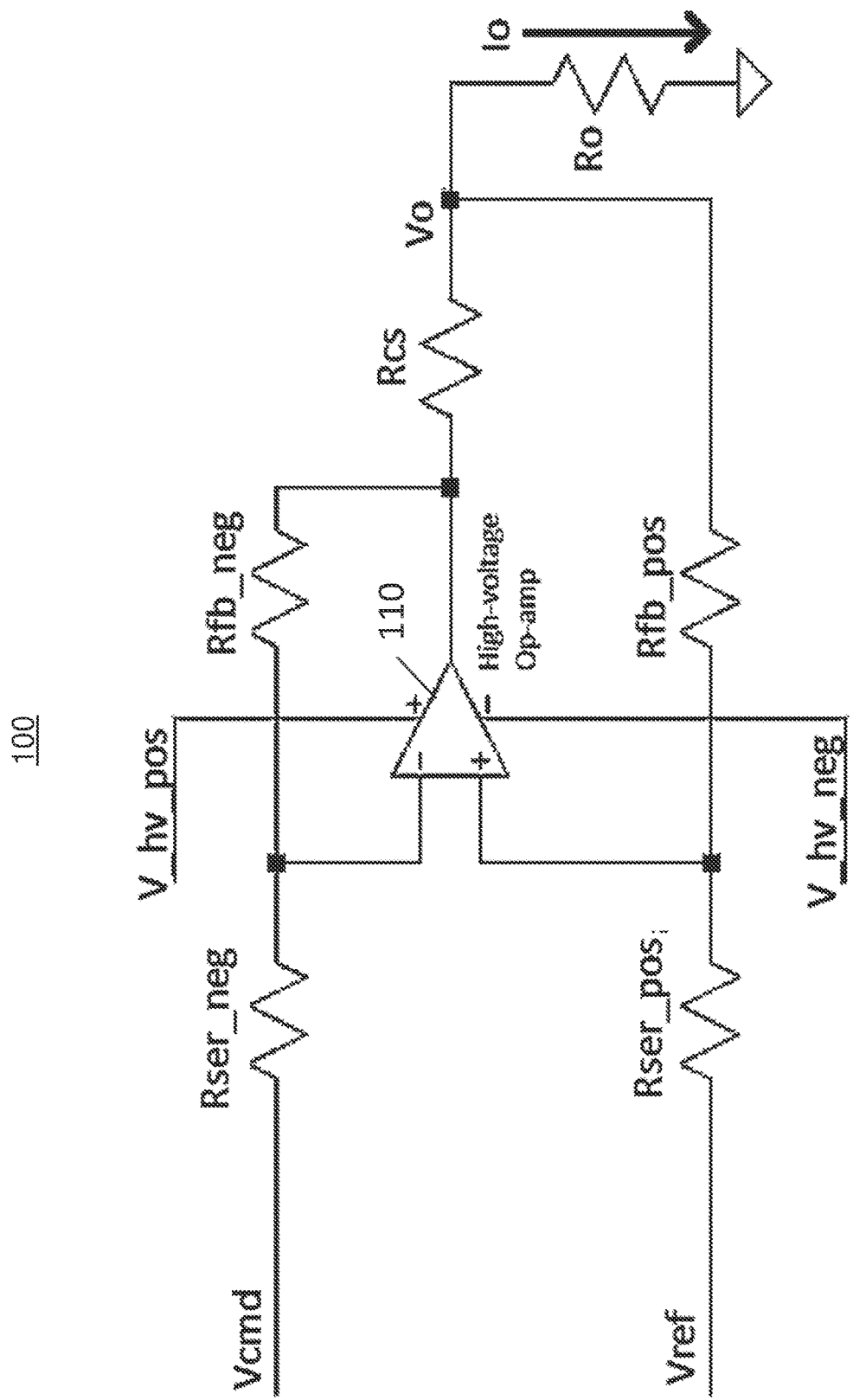
FIG. 1 depicts a conventional operational amplifier configuration.

Now referring to FIG. 1, an operational amplifier configuration 100 is shown. The operational amplifier 110 is a high-voltage bilateral operational amplifier current source circuit. The operational amplifier 110 includes a non-inverting input ("+" input) and an inverting input ("−" input). The non-inverting input is coupled to the reference signal Vref through a serial resistor Rser_pos and the inverting input is coupled to the command signal Vcmd through a serial resistor Rser_neg. The inverting input receives feedback from the output of the operational amplifier 110 which is fed back over the resistor Rfb_neg. The non-inverting input receives a feedback signal from the output over the resistor Rfb_pos.

An output of the operational amplifier 110 that is provided to the load is shown as having a voltage $V_o$ and an output resistance and current that is represented by $R_o$ and $I_o$, respectively. The operational amplifier 110 is also coupled to the high voltage positive power supply (V_hv_pos) and the high voltage negative power supply (V_hv_neg).

The voltage reference "Vref" is a DC voltage reference with an amplitude halfway between the logic level supply voltage and ground. The output current $I_o$ is controlled by the command signal provided to the inverting input of the operational amplifier 110. In some embodiments, the command signal is a voltage signal. A command voltage of zero volts sets the output current to a maximum positive current, a command voltage equal to the reference voltage sets the output to zero current, and a command voltage equal to the logic level supply voltage sets the output to maximum negative current. The command values in between these ranges scale the output current proportionally.

The topology provided in FIG. 1 can be used for application in which bipolar output current and large output voltage are necessary in order to source adequate drive current under all conditions. However, this circuit is subject to a large offset voltage error in the operational amplifier which contributes to the case where the drive could source or sink unacceptably large output current when the drive is meant to output zero current.

The techniques described herein provide operating the circuit in a disabled mode which has been added to a high-voltage bilateral operation amplifier current source circuit for the purpose of output error current reduction when the output is desired to be OFF.

Figure 2:
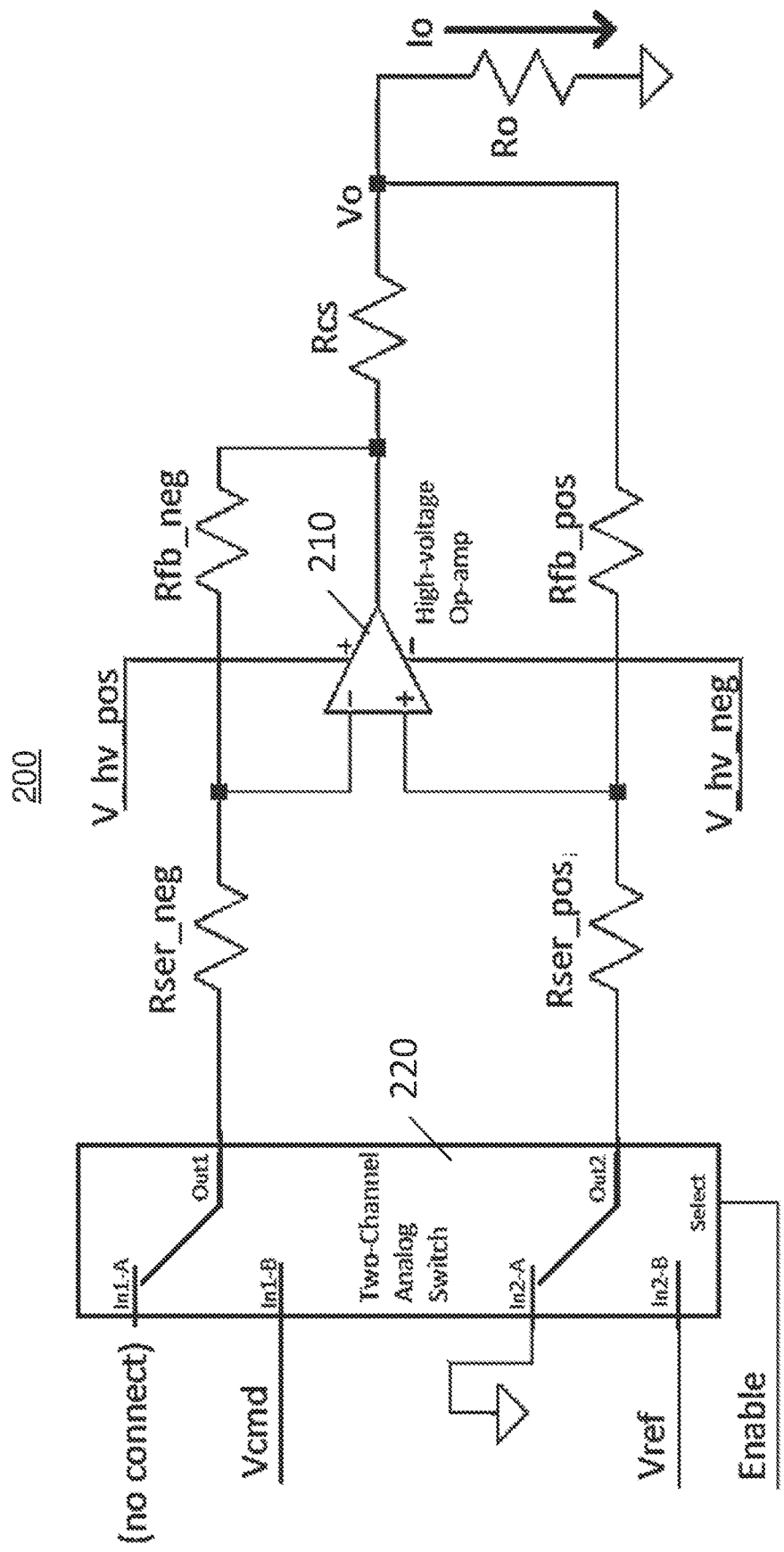
FIG. 2 depicts an operational amplifier in accordance with one or more embodiments of the invention.

Now referring to FIG. 2, a circuit architecture 200 for operating the operational amplifier in a disabled mode in accordance with one or more embodiments of the invention is shown. The circuit 200 includes an operational amplifier 210 similar to that shown in FIG. 1. The circuit 200 includes a two-channel analog switch 220 (hereinafter referred to as "analog switch 220") that is coupled to the differential inputs of the operational amplifier 210.

The analog switch 220 can be controlled to be operated in the normal mode or the disabled mode. The analog switch 220 includes a first channel that is configured to connect the command signal (Vcmd) with an input of the operational amplifier 210 and the second channel that is configured to connect the reference signal (Vref) to the other input of the operational amplifier 210.

When operated in the disable mode, the analog switch 220 serves to open the command signal to the inverting side of the amplifier stage and ground the reference signal to the non-inverting side of the amplifier stage. This reconfigures the circuit to reduce feed-forward gain and eliminates common-mode voltage from being transferred from the reference input to the output by disconnecting the signals provided to the inputs of the operational amplifier 210.

In one or more embodiments, an enable signal (Enable) is provided to the analog switch 220 to operate the switch is operated in the normal mode. That is, the command input and the reference input is switched ON and connected to the respective inputs of the operational amplifier 210 when the Enable signal is provided. Responsive to the "ENABLE" signal being removed or deactivated the mode is switched to operate in the disabled mode which reduces the error current that is produced by the operational amplifier.

Figure 3:
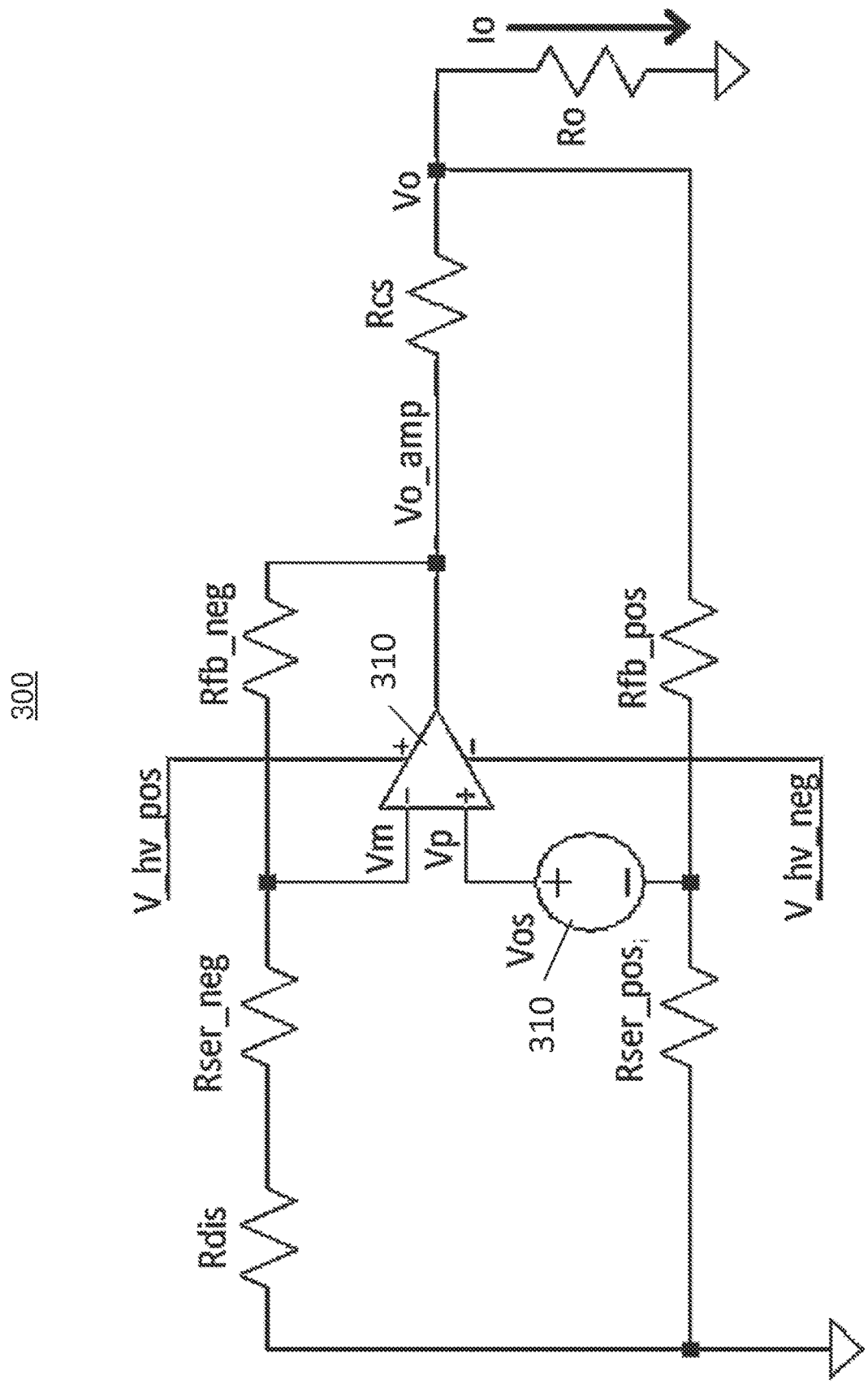
FIG. 3 depicts a representative circuit for the operational amplifier of FIG. 2 in accordance with one or more embodiments of the invention.

FIG. 3 depicts a model of the analog switch 220 of FIG. 2 with the resistor Rdis and the internal error of the amplifier which is represented by Vos. When operating in a normal mode the parameter Rdis is at 0 ohms and when configured in a disabled mode the parameter Rdis is open or infinite resistance. The following Equations provide a derivation of the output current $I_o$ when the output current is commanded to be zero:

$$V_p = V_m$$

where $v_m$ is the voltage applied to the inverting input of the operational amplifier and $v_p$ is the voltage applied to the non-inverting input. Equation 1 provides the following:

$$V_{os} + V_o \left( \frac{Rser_{pos}}{Rser_{pos} + Rfb_{pos}} \right) = V_{oamp} * \left( \frac{Rser_{neg} + Rdis}{Rser_{neg} + Rdis + Rfb_{neg}} \right) \quad \text{(Eq. 1)}$$

The amplifier output node Vo_amp is related to the output voltage "Vo" as shown in the following set of Equations:

$$I_0 = \frac{V_0}{R_0} = \frac{V_{0amp} - V_0}{Rcs} \quad \text{(Eq. 2)}$$

$$V_o * \left( \frac{1}{R_0} + \frac{1}{Rcs} \right) = V_{oamp} \left( \frac{1}{Rcs} \right)$$

$$V_{oamp} = V_o * \left( 1 + \frac{Rcs}{R_o} \right)$$

Substituting Equation 2 into Equation 1, the following Equations are derived:

$$V_{os} + V_o\left(\frac{Rser_{pos}}{Rser_{pos} + Rfb_{pos}}\right) = V_o * \left(1 + \frac{Rcs}{R_o}\right)*\left(\frac{Rser_{neg} + Rdis}{Rser_{neg} + Rdis + Rfb_{neg}}\right)$$

$$V_{os} = \left[\left(1 + \frac{Rcs}{R_o}\right)*\left(\frac{Rser_{neg} + Rdis}{Rser_{neg} + Rdis + Rfb_{neg}}\right) - \left(\frac{Rser_{pos}}{Rser_{pos} + Rfb_{pos}}\right)\right]$$

$$V_o = \frac{V_{os}}{\left[\left(1 + \frac{Rcs}{R_o}\right)*\left(\frac{Rser_{neg} + Rdis}{Rser_{neg} + Rdis + Rfb_{neg}}\right) - \left(\frac{Rser_{pos}}{Rser_{pos} + Rfb_{pos}}\right)\right]}$$

The output error current $Io_{error\_original}$ is derived when operating in the normal mode and is provided by the following Equation:

$$Io_{error\_original} = \frac{V_{os}}{R_o\left[\left(1 + \frac{Rcs}{R_o}\right)*\left(\frac{Rser_{neg} + Rdis}{Rser_{neg} + Rdis + Rfb_{neg}}\right) - \left(\frac{Rser_{pos}}{Rser_{pos} + Rfb_{pos}}\right)\right]}$$

When "Rdis" is changed to an open circuit, a denominator ratio changes from a value less than one to a value of unity, which significantly reduces the output current induced due to the operational amplifier offset voltage:

$$Io_{error\_disabled} = \frac{V_{0s}}{R_o\left[\left(1 + \frac{Rcs}{R_o}\right) - \left(\frac{Rser_{pos}}{Rser_{pos} + Rfb_{pos}}\right)\right]}$$

In the following non-limiting example, a design using a high-voltage operational amplifier with a maximum offset voltage of 50 mV using 5 V logic designed for a maximum output current drive capability of 250 mA and a 100Ω load is provided. Using the following parameters, Vos=50 mV; R0=100Ω; Rcs 5Ω; Rser 100 kΩ; Rfb=50 kΩ; Vref=2.5 V; $V_{cmdMin}$=0 V; and $V_{cmdMax}$=5 V; the maximum and minimum output current are calculated as provided in the following calculations:

$$Io_{enable\ max} = -\frac{(0 - 2.5)*\left(\frac{50k}{100k}\right)}{5} = 250 \text{ mA}$$

$$Io_{enable\ min} = -\frac{(5 - 2.5)*\left(\frac{50k}{100k}\right)}{5} = -250 \text{ mA}$$

In addition, the normal mode current and disabled mode current results in the following:

$$Io_{error\_original} = 15 \text{ mA}$$

$$Io_{error\_disabled} = 15 \text{ mA}$$

The example provided above demonstrates a practical example in which the output error current is reduced from 15 mA to 1.3 mA, which is 8.7% of the original output error current.

The technical effects and benefits provide an efficient design and integrated circuit solution to reduce the output current when the "drive" should be off when operating in a disabled mode. Using the configuration described herein the operational amplifier is not enabled during a disabled mode and is not amplifying as large of an error caused by the offset voltage.

In addition, by implementing the analog switch 220, there is no requirement to use a switch at the output coupled to the load which would require a high voltage switch that is expensive, heavy and bulky to accomplish the disconnection of the input. The techniques describe controls the voltage with a 5 V power supply instead of using a high voltage switch design.

A detailed description of one or more embodiments of the disclosed apparatus and method are presented herein by way of exemplification and not limitation with reference to the Figures.

The term "about" is intended to include the degree of error associated with measurement of the particular quantity based upon the equipment available at the time of filing the application.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A circuit configured to operate in a disabled mode for error reduction for high-voltage bilateral operational amplifier current source, the circuit comprising:
    an operational amplifier; and
    a switching circuit coupled to the operational amplifier, wherein the switching circuit is operable in a normal mode and a disabled mode, wherein a first channel of the switching circuit is controlled to be connected to an inverting input of the operational amplifier and a second channel of the switching circuit is controlled to be connected to a non-inverting input of the operational amplifier,
    wherein the disabled mode reduces error current at the output of the operational amplifier, wherein when operating in the disabled mode the first channel and the second channel of the switching circuit receive different input signals.

2. The circuit of claim 1, wherein the switching circuit is a two-channel analog switch.

3. The circuit of claim 1, wherein the first channel of the switching circuit is configured to receive a command voltage and a second channel of the switching circuit is configured to receive a reference voltage.

4. The circuit of claim 3, wherein the first channel and the second channel of the switching circuit are configured to be operated in the normal mode and the disabled mode.

5. The circuit of claim 4, wherein when in the disabled mode the first channel of the switching circuit is disconnected from the command signal and the second channel is disconnected from the reference signal and connected to a ground.

6. The circuit of claim 5, wherein the switching circuit is controlled by an enable signal.

7. The circuit of claim 6, wherein the switching circuit is operated in the normal mode when the enable signal is received.

8. A method for operating a circuit in a disabled mode for error reduction, the method comprising:
controlling a mode of a switching circuit, wherein the mode comprises a normal mode and disabled mode wherein the disabled mode reduces an error current at an output of the operational amplifier;
operating an operational amplifier based at least in part on the mode, wherein the operational amplifier is connected to the switching circuit,
wherein a first channel of the switching circuit is controlled to be connected to an inverting input of the operational amplifier and a second channel of the switching circuit is controlled to be connected to a non-inverting input of the operational amplifier,
wherein when operating in the disabled mode the first channel and the second channel of the switching circuit receive different input signals.

9. The method of claim 8, wherein controlling the mode of the switching circuit comprises switching the mode of the switching circuit, wherein the switching circuit is a two-channel analog switch.

10. The method of claim 8, further comprises receiving a command voltage at the first channel of the switching circuit and receiving a reference voltage signal at the second channel of the switching circuit.

11. The method of claim 10, wherein the first channel and the second channel of the switching circuit are configured to be operated in the normal mode and the disabled mode.

12. The method of claim 11, wherein when in the disabled mode the first channel of the switching circuit is disconnected from the command signal and the second channel is disconnected from the reference signal and connected to a ground.

13. The method of claim 12, wherein the switching circuit is controlled by an enable signal.

14. The method of claim 13, further comprising operating in the normal mode responsive to receiving the enable signal.

* * * * *